(12) United States Patent
Kataoka

(10) Patent No.: US 9,400,302 B2
(45) Date of Patent: Jul. 26, 2016

(54) EARTH LEAKAGE DETECTOR WITH SUFFERED CURRENT-BLOCKING FUNCTION

(75) Inventor: Kohzoh Kataoka, Yamato (JP)

(73) Assignee: LIFETECHNOS CO., LTD., Yamato-Shi, Kanagawa (JP)

( * ) Notice: Subject to any disclaimer, the term of this patent is extended or adjusted under 35 U.S.C. 154(b) by 573 days.

(21) Appl. No.: 13/699,391

(22) PCT Filed: Apr. 25, 2011

(86) PCT No.: PCT/JP2011/060019
§ 371 (c)(1),
(2), (4) Date: Nov. 21, 2012

(87) PCT Pub. No.: WO2011/148749
PCT Pub. Date: Dec. 1, 2011

(65) Prior Publication Data
US 2013/0063842 A1    Mar. 14, 2013

(30) Foreign Application Priority Data
May 24, 2010    (JP) ................. 2010-118544

(51) Int. Cl.
*H02H 3/00*    (2006.01)
*H02H 9/08*    (2006.01)
*G01R 31/02*    (2006.01)
(Continued)

(52) U.S. Cl.
CPC ............. *G01R 31/025* (2013.01); *H02H 3/347* (2013.01)

(58) Field of Classification Search
CPC ............................ H03H 3/347; G01R 31/025

USPC .................................................. 361/42, 4, 2
See application file for complete search history.

(56) References Cited

U.S. PATENT DOCUMENTS 3,968,409 A  *  7/1976  Windler ................. 361/109

FOREIGN PATENT DOCUMENTS

| CN | 101251568 A | 8/2008 |
|---|---|---|
| JP | 2001-224129 A | 8/2001 |
| JP | 2001-258149 A | 9/2001 |

(Continued)

OTHER PUBLICATIONS

International Search Report for International application No. PCT/JP2011/060019. mailing date of May 31, 2011, with English translation.

(Continued)

*Primary Examiner* — Thienvu Tran
*Assistant Examiner* — Lucy Thomas
(74) *Attorney, Agent, or Firm* — Cantor Colburn LLP

(57) ABSTRACT

A leakage detector is provided with the addition of an output control circuit that monitors a circuit wire-to-ground voltage, which is at the root of a suffered operation and produced between a transformer B-class grounding phase of a monitored circuit and a D or C-class grounding electrode or a ground structure etc. of an electrical equipment connected to the grounding electrode, execute a phase judgment of a leakage current detected by a zero-phase current transformer on the basis of the monitored voltage, and stop an output operation of the leakage detector when the leakage current is a suffered current flowing from a load side L of the detecting zero-phase current transformer toward the power side K, i.e. the transformer and when the circuit wire-to-ground voltage exceeds an appropriately-established dynamic sensitivity voltage value.

3 Claims, 5 Drawing Sheets

(51) Int. Cl.
*H02H 3/347* (2006.01)
*H02H 7/00* (2006.01)

(56) References Cited

FOREIGN PATENT DOCUMENTS

| JP | 2002-07660 | * | 1/2002 |
| JP | 2002-27660 A | | 1/2002 |
| JP | 2002-320325 A | | 10/2002 |
| JP | 2003-219553 A | | 7/2003 |
| JP | 3517737 B2 | | 2/2004 |

OTHER PUBLICATIONS

Chinese Notification of First Examination Statement in reference to Patent Application No. 2011800255861; Date of Mailing: Aug. 12, 2014, with English translation.

* cited by examiner

EARTH LEAKAGE DETECTOR WITH SUFFERED CURRENT-BLOCKING FUNCTION

CROSS REFERENCE TO RELATED APPLICATIONS

This is a U.S. national stage of application No. PCT/JP2011/060019, filed on 25 Apr. 2011. Priority under 35 U.S.C. §119(a) and 35 U.S.C. §365(b) is claimed from Japanese Application No. 2010-118544, filed 24 May 2010, the disclosure of which are also incorporated herein by reference.

TECHNICAL FIELD

The present invention relates to an earth leakage detector, such as an earth leakage relay and an earth leakage breaker, for ensuring safety and security of electricity.

BACKGROUND ARTS

An earth leakage detector, such as an earth leakage breaker and an earth leakage relay for electric shock prevention, which has been developed for the purpose of preventing electrification fatal and injury accident with mobile-portable electric machinery and appliance in accordance with occupational safety and health regulations, has become popular for its low cost and ease of use. For this reason, this earth leakage detector has been also in heavy usage for electrical shock prevention, leakage alarm and earth blocking in even stationary industrial production installations.

In recent years, the number of equipments containing highly-developed control systems has been getting increased in an electrical load installation. For the purpose of preventing a wide-area scattering of noise power components generated from the equipments or an erroneous operation of the installation, a noise canceller having a high-volume capacitance stands besides the installation. Due to this parallel establishment of the noise canceller, the productivity is fraught with obstacles, for example, increased regular leakage current, blackout or unnecessary alarm caused by an unnecessary suffered operation due to a suffered current derived from a ground fault on the side of a power source of the installation, etc.

PRIOR ART LITERATURES

Patent Documents

Patent documents 1: Japanese Patent No. 3517737

SUMMARY OF THE INVENTION

Problems to be Resolved

If a grounding fault occurs within the same system that shares a B-class grounding construction constructed to a transformer of a substation, ground-fault current flows into earth resistance Rdb between a building's grounded construction as a grounding target (which is generally connected to a D-class or C-class grounding electrode) and B-class grounding electrodes of respective transformers, causing a descent voltage. Then, this descent voltage in the form of a circuit wire-to-ground voltage Vdb is applied to grounding capacitances of respective distribution systems connected to the earth resistance Rdb in parallel, causing flowing of a zero-phase leakage current as a suffered current. As a result, there is frequently-caused a phenomenon where earth leakage detectors, such as an earth leakage relay and an earth leakage breaker, are subjected to so-called "suffered operation". In addition, in even a load circuit where circuit respective phases' inter-grounding capacitances come to equilibrium causing respective leakage currents to be cancelled with each other invisibly, such as a single-phase three-wire system circuit and a star connection circuit, a circuit wire-to-ground voltage Vdb resulting from an earth fault leads to a flowing of a suffered current toward a resultant value of respective phases' wire-to-ground capacitances since the circuit inter-grounding voltage is a zero-phase voltage, causing a suffered operation.

FIG. 3 is a diagram to explain the suffered operation, showing an example that conventional earth leakage breakers ELB1, ELB2 are installed in a standard substation where both a neutral phase v of a single-phase three-wire system electric light transformer Tr1 and an end S phase of a three-phase three-wire delta-connection-class power transformer Tr2 are collectively connected to a common ground bus Ebn for B-class grounding and further connected to a grounding electrode EB of a B-class grounding construction. Referring to FIG. 3, we now describe the operation at a grounding fault that a T-phase of the power transformer is connected to ground through a ground resistance Rg at a point P. The ground resistance Rg is an important factor for the suffered operation. Thus, as the ground resistance Rg comes close to 0Ω, the circuit wire-to-ground voltage Vdb grows to cause the likelihood of suffered operation to be increased. The ground-fault current Ig produced through the ground resistance Rg is divided, through D-class grounding electrodes and ground structures connected to these electrodes, into: a suffered current Ic2 returning the power transformer through it's a wire-to-ground capacitance C2 for R, S-phases; a suffered current Ic1 returning the power transformer through a capacitance C1 for u, v and w-phases of the electric light transformer; and a current Ib passing through an earth resistance Rdb between a grounding electrode ED of a D-class grounding construction and a grounding electrode EB of a B-class grounding construction and successively returning the power transformer through a B-class grounding wire and a subsequent common ground bus Ebn. At this time, a descent voltage Vdb caused by the current Ib flowing into the resistance Rdb is simultaneously applied to the capacitances C1, C2 on the low-voltage/load sides of respective transformers to cause a flow of the above-mentioned suffered currents Ic2, Ic1. If the current Ic1 exceeds a dynamic sensitivity current of the earth leakage breaker ELB1 arranged in a low-voltage/load circuit of the electric light transformer Tr1, the earth leakage breaker ELB1 executes the suffered operation, i.e. an unnecessary operation to cause an obstruction of cutting electricity to the load side. If a current obtained by subtracting one's own suffered current from the ground-fault current Ig exceeds a dynamic sensitivity current of the earth leakage breaker ELB2 arranged in the power transformer, the earth leakage breaker ELB2 performs a normal cutoff operation due to its own earth fault after a predetermined operative time period has passed. However, for a time period from the occurrence of earth fault till the cutoff operation, a ground-fault current determined by the resistances Rg, Rdb and the circuit wire-to-ground capacitances C1, C2 or the like. As you can understand from the figure, a voltage to ground between the earth phase T and the B-class grounding phase S is proportionally divided by the ground resistance Rg and the grounding electrode-to-electrode resistance Rdb. In case of a spark earth fault generated during the maintenance on equipment, as the ground resistance Rg is substantially 0Ω, the circuit wire-to-ground voltage Vdb generated in the resistance Rdb becomes generally equal to a voltage between T, S-phases of the power transformer, so that the suffered operation occurs frequently.

Although the current countermeasure is to prevent an occurrence of suffered operation by setting a dynamic sensitivity current larger than a suffered current flowing by a maximum circuit wire-to-ground voltage generated by a ground fault, it becomes difficult to make a high-sensitivity operation required for an electrical shock prevention. Alternatively, it is also effective to adopt a ground directional relaying method on detection of a zero-phase current. However, if this method is applied to a direct-grounding distribution type circuit undertaking a B-class grounding construction carelessly, it is supposed that it becomes difficult to ensure a stable zero-phase voltage in a situation where the resistance between grounding electrodes is increased/decreased or denied due to integrated grounding or the like. After all, it is considered difficult to satisfy both of the prevention of a suffered operation and the high-sensitivity operation for electrical shock prevention.

Solutions to the Problems

Standardizing on a conventional earth leakage detector, such as a conventional leakage breaker or a leakage relay, additionally, the present invention is characterized in that an unnecessary operation due to a suffered current is prevented without disturbing the high-sensitivity operational area of the earth leakage detector with an output control circuit configured to: monitor a circuit wire-to-ground voltage generated between a B-class grounding phase of a transformer for a circuit to be monitored and a D or C-class grounding electrode of the transformer or a grounding structure etc. of an electric equipment connected to the D or C-class grounding electrode; judge the phase of a leakage current detected by the zero-phase current transformer, based on the circuit wire-to-ground voltage; and stop the output operation of the earth leakage detector if the leakage current is a suffered current flowing from the load side L of the detecting zero-phase current transformer toward its power side K, i.e. a transformer's side and if the leakage current also exceeds an appropriately-established dynamic sensitivity voltage value.

Concretely describing the constitution of the present invention, the above problem is resolved by an earth leakage detector comprising: a leakage detecting circuit formed by: a zero-phase current transformer ZCT configured to detect a leakage current of a circuit to be monitored; a current-establishment-level detecting circuit configured to transmit a leakage occurrence signal when a value of the leakage current detected by the zero phase current transformer ZCT exceeds an appropriately-established dynamic sensitivity current value; and an alarm output circuit configured to generate a leakage alarm signal on receipt of the leakage occurrence signal; a suffered-phase detecting circuit configured to detect a circuit wire-to-ground voltage produced between a common B-class ground circuit for the circuit to be monitored or a group of transformers and a D-class grounding electrode or a ground structure, such as an iron box of an electrical equipment and a building iron frame, connected to the D-class grounding electrode and also configured to generate a suffered-phase detection signal when a direction of the leakage current judged based on the circuit wire-to-ground voltage is identical to the direction of a suffered current flowing from a load side L of the detecting zero-phase current transformer toward a power side K thereof, that is, the transformer; a voltage-establishment-level detecting circuit configured to generate a voltage-level detection signal when the circuit wire-to-ground voltage exceeds an appropriately-established dynamic sensitivity voltage value; a suffered-operating-condition judging circuit configured to output a suffered-operating-condition detection signal when both the suffered-phase detection signal and the voltage-level detection signal accord with each other; an output-stop-signal outputting circuit configured to transmit an output stop signal to the output control signal on receipt of the suffered-operating-condition detection signal; and an output control signal configured to stop the leakage alarm signal transmitted by the leakage detecting circuit on receipt of an output stop signal.

Effects of the Invention

According to the present invention, the dynamic sensitivity voltage value of the voltage-establishment-level detecting circuit is set to a voltage at which the suffered leakage current by the application of the circuit wire-to-ground voltage on the circuit wire-to-ground capacitance of the circuit to be monitored falls under becomes lower than the established dynamic sensitivity current value of the earth leakage detector, and the leakage alarm operation is stopped only when it can be confirmed that the circuit wire-to-ground voltage exceeds the dynamic sensitivity voltage value and that the direction of the leakage current judged from the phase of the circuit wire-to-ground voltage Vdb coincide with the phase of a suffered current due to a ground fault on the power side, which flows from the L-side of the detecting zero-phase current transformer toward the K-side, so that the leakage event in question does not come from a grounding fault in the monitored circuit. Thus, there is no influence on the usual leakage detection in a high-sensitivity operational area less than the established dynamic sensitivity voltage value, and the dynamic sensitivity current can be supersensitized so as to avoid an electric shock. Despite the so-supersensitized dynamic sensitivity current, as a matter of course, it is possible to avoid a suffered operation since the circuit wire-to-ground voltage is generated at the complete grounding by a spark grounding of the other circuit, such as a ground fault of the power side. In other words, the earth leakage detector of the invention does not obstruct the usual operation of a leakage breaker, a leakage relay or the like in its high-sensitivity operational area in a range where the circuit wire-to-ground voltage is less than the established dynamic sensitivity voltage value. Instead, the earth leakage detector of the invention is formed so as to stop the leakage cutoff operation or the leakage alarm operation since the output control circuit is activated for a "trip-locked" condition only when the phase of the leakage current is judged as the suffered operational condition in a "suffered-operation" potential area where the circuit wire-to-ground voltage exceeds the established dynamic sensitivity voltage value. Accordingly, the present invention is applicable to even a "high-sensitive" type shock-guard leakage breaker or a "high-sensitive" type leakage relay with a sense of security.

Even when the present earth leakage detector is used in a construction field having a variety of grounding methods mixed, such as a case that a resistance between a B-class grounding electrode and a D-class grounding electrode varies and another case that a resistance between grounding electrodes vanishes in the integrated grounding method of converging respective grounding electrodes for communization, the present earth leakage detector operates as a conventional leakage detector as long as a circuit wire-to-ground voltage does not occur. Therefore, it is possible to use the present earth leakage detector with a sense of security.

In an electric control system maintenance work etc. of productive facilities requiring a maintenance while causing no blackout, the utilization on prevention of electrification accidents could be greatly expected in a shock-guard and high-sensitivity leakage breaker with suffering-lock to which the present invention is applied.

In view of its usability, it is easy to incorporate such a shock-guard and high-sensitivity leakage breaker with suffering-lock on the application of the present invention into a construction because one has only to connect an earth terminal of the present leakage breaker with a D-class grounding or a ground structure of an electrical equipment. Even if this ground connection fails, the present leakage breaker has a low risk in undertaking the construction since it can serve as a conventional high-sensitivity leakage breaker.

EMBODIMENTS OF THE INVENTION

An object of the invention is to prevent a suffered operation caused by a ground fault on the power side of the present detector or the same of another circuit in an identical B-class grounding shared system without disturbing a high-sensitivity operation of the earth leakage detector, such as a shock-guard leakage breaker and a leakage relay. This object is realized by an earth leakage detecting method of executing the control of monitoring a circuit wire-to-ground voltage between a B-class grounding electrode of a transformer and its D-class or C-class grounding electrode and further stopping the output operation of the earth leakage detector under conditions that: the direction of a leakage current detected by a zero-phase current transformer of the earth leakage detector on the basis of a phase of the circuit wire-to-ground voltage is judged as that of a suffered leakage current flowing from the load side L of the detecting zero-phase current transformer toward its power side K, that is, a suffered current by a ground fault on the power side of the detecting zero-phase current transformer; and the monitored circuit wire-to-ground voltage exceeds an allowable maximum voltage established-value required to prevent the suffered operation.

Embodiment 1

Figure 1:
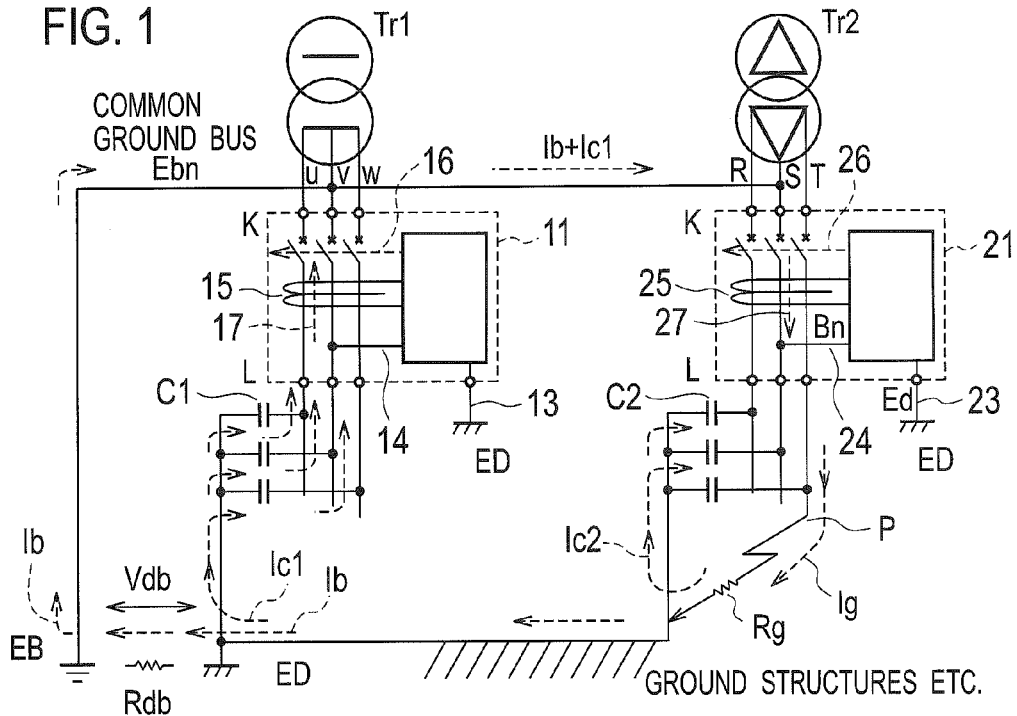
FIG. 1 is a diagram showing an embodiment that earth leakage breakers with suffering-lock of the present invention are installed in a low-voltage main circuit of a transformer of a substitution formed by a single-phase three-wire system transformer and a three-phase three-wire delta connection type transformer undertaking a common B-class grounding construction.

FIG. 1 shows an embodiment that earth leakage breakers 11, 21 with suffering-lock of the present invention are installed in a standard substation where both a neutral phase v of a single-phase three-wire system electric light transformer Tr1 and an end S phase of a three-phase three-wire power transformer Tr2 are collectively connected to a common ground bus Ebn for B-class grounding and further connected to a grounding electrode EB of a B-class grounding construction. The earth leakage breaker 11 has the same performance as that of the earth leakage breaker 21. Referring to FIG. 1, we now describe the operation at a grounding fault that a T-phase of the power transformer Tr2 is connected to ground through a ground-fault resistance Rg at a point P. Through the intermediary of D-class grounding electrodes ED or ground structures connected to these electrodes ED, the ground-fault current Ig produced through the ground-fault resistance Rg is divided into a current Ic2 returning the power transformer via a wire-to-ground capacitance C2 for R, S-phases of the power transformer, a current Ic1 passing through a capacitance C1 for u, v and w-phases of the electric light transformer Tr1 and finally returning the power transformer Tr2 via the electric light transformer Tr1 and a current Ib passing through an earth resistance Rdb between a grounding electrode ED of a D-class grounding construction and a grounding electrode EB of a B-class grounding construction and successively returning the power transformer Tr2 via a B-class grounding wire and a subsequent common ground bus Ebn. At this time, a descent voltage Vdb at the resistance Rdb allowing the current Ib to flow therethrough is simultaneously applied to the circuit wire-to-ground capacitances C1, C2 connected in parallel with the resistance Rdb, causing a flow of suffered currents Ic2, Ic1.

The earth leakage breaker 11 with suffering-lock of the present invention installed in the load circuit of the transformer Tr1 is provided with the addition of an output control circuit to the constitution of the usual earth leakage breaker which detects a leak current 17 by a normally built-in zero-phase current transformer 15 and also breaks built-in breakers through a cutoff signal 16 when the detected leak current exceeds an appropriately-established dynamic sensitivity current value. Meanwhile, in order to monitor the suffered condition, the above earth leakage breaker monitors the circuit wire-to-ground voltage Vdb between the grounding electrodes Ed and EB through connecting wires 13 and 14 and also performs a phase comparison between this circuit wire-to-ground voltage and the leak current. Consequently, if the leak current has a reversed phase, in other words, the leak current is a current flowing from the load side L of the zero-phase current transformer 15 toward the power side K, then the earth leakage breaker judges that this current is a suffered current and further outputs a suffered-phase detection signal. In addition, if the circuit wire-to-ground voltage Vdb exceeds an appropriately-established dynamic sensitivity voltage value, then the earth leakage breaker controls to stop an output operation, avoiding an unnecessary suffered operation. In the example of FIG. 1, since the leak current 17 flows from the grounding electrode ED to the zero-phase current transformer 15 (from its L-side to the K-side) through the wire-to-ground capacitance C1 as shown with a dashed arrow, the leak current has a reversed phase opposed to the phase of the circuit wire-to-ground voltage, causing a generation of the suffered-phase detection signal. If the suffered-phase detection signal is combined with a voltage-level detection signal, the suffered-operating-condition detection signal is outputted, so that a generation of an output signal by a leakage alarm signal is stopped in the output control circuit. Consequently, the cutoff operation is not performed to avoid an unnecessary operation with the present current.

The earth leakage breaker 21 with suffering-lock of the present invention installed in the load circuit of the transformer Tr2 is provided by adding an output control circuit to the constitution of the usual earth leakage breaker which detects a leak current 27 by a normally built-in zero-phase current transformer 25 and also breaks built-in breakers through a cutoff signal 26 when the detected leak current exceeds a predetermined operating current. Meanwhile, in order to monitor the suffered condition, this earth leakage breaker monitors the circuit wire-to-ground voltage Vdb between the grounding electrodes Ed and EB through connecting wires 23 and 24 and also performs a phase comparison between this voltage and the leak current 27. Consequently, if the leak current has a common-mode phase, then the earth leakage breaker judges that this current is a breaker's own ground-fault current, so that the suffered-phase detection signal is not generated. Accordingly, even when the circuit wire-to-ground voltage Vdb exceeds the established dynamic sensitivity voltage value, it is not judged that the circuit is in the suffered operational condition. Then, the leakage alarm signal is not generated against the output control circuit, so that control, such as output stop, is not performed. Consequently, the cutoff operation is performed in the form of a normal leakage breaker. In the example of FIG. 1, the leakage current 27 becomes equal to the vector sum of the current Ig flowing from a T-phase of the power transformer Tr2 toward the grounding electrode ED through the grounding point P and the ground-fault resistance RG and the breaker's own suffered current IC flowing from the grounding electrode ED toward S, R-phases of the same transformer through the breaker's own wire-to-ground capacitance C2. However, as the value of the resistance Rdb is much larger an impedance of the capacitance C2, of course, the current flows in a direction extending from the transformer's side K of the zero-phase transformer to the load side L as shown with a broken arrow 27, exhibiting the same phase as the vector of the circuit wire-to-ground resistance Vdb to generate no suffered-phase detection signal. Accordingly, even if the circuit wire-to-ground voltage exceeds the established dynamic sensitivity voltage value, the breaker neither judge that the circuit is in the suffered operational condition nor perform any control against the leakage alarm outputted, so that the leakage breaker will operate in the normal mode.

Figure 2:
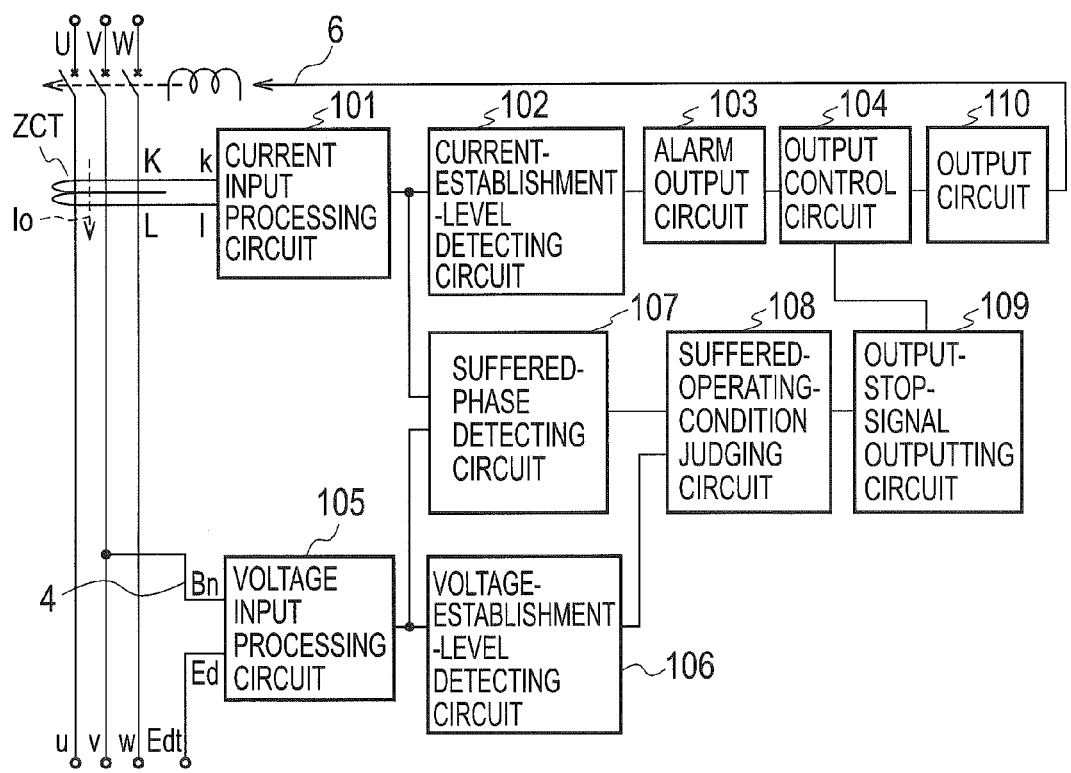
FIG. 2 is an operational distribution diagram of the earth leakage breaker with suffering-lock for the single-phase three-wire system transformer and the three-phase three-wire delta connection type transformer.
Figure 3:
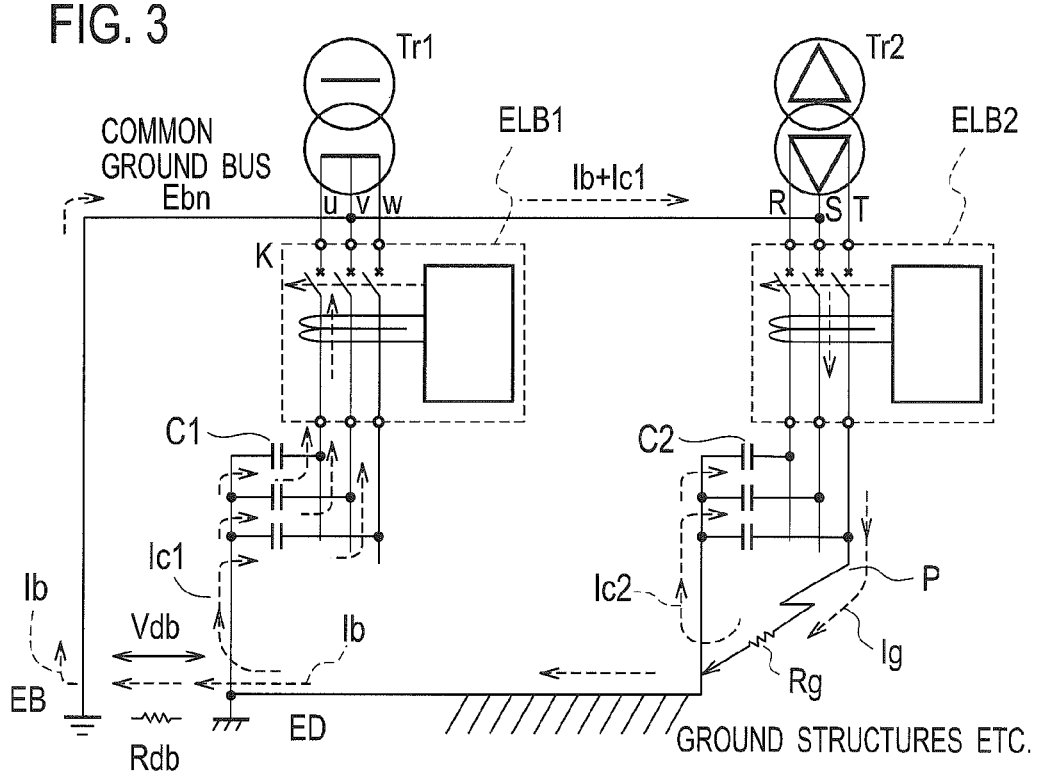
FIG. 3 is a diagram to explain a suffered operation.

FIG. 2 is a detailed operational distribution diagram of the earth leakage breaker 11 or 21 with suffering-lock. The leakage current Io (17 or 27 of FIG. 1) is detected by the zero-phase current transformer ZCT (15 or 25 of FIG. 1), and its output is inputted to inputs k, l of a current input processing circuit 101 for executing processes, such as noise control, surge protection and amplification. Upon processing the output, it is transmitted to a current-establishment-level detecting circuit 102. In this circuit, the occurrence of earth leakage is recognized since the detected current exceeds an appropriately-established dynamic sensitivity current value. Then, a leakage-occurrence signal is transmitted to an alarm output circuit 103 and successively, a leakage alarm signal is transmitted from the alarm output signal 103 to an output control circuit 104. On the other hand, an input terminal Bn of a voltage input processing circuit 105 is connected to a B-class grounding phase of a monitored circuit through a connecting wire 4 (14 or 24 of FIG. 1), while this phase is connected to the B-class grounding electrode EB through the common ground bus Ebn, as shown in FIG. 1. Further, the input terminal ED of the voltage input processing circuit 105 is connected to a D-class grounding electrode or the like through an externally-drawn grounding terminal Edt of this detector. Thus, the circuit wire-to-ground voltage Vdb between the B-class grounding electrode EB and the D-class grounding electrode ED of the circuit to be monitored is supplied between the terminals Bn and Ed. In the voltage input processing circuit 105, various processes, such as noise control, surge protection and amplification, is applied to the input voltage and thereafter, it is transmitted to a voltage-establishment-level detecting circuit 106. In this circuit, when the input voltage exceeds an appropriately-established dynamic sensitivity voltage value, the occurrence of a circuit wire-to-ground voltage with the potentiality of causing the suffered operation is recognized, and its voltage-level detection signal is transmitted to a suffered-operating-condition judging circuit 108. A suffered-phase detecting circuit 107 is supplied with a current phase signal from the current input processing circuit 101 and a voltage phase signal from the voltage input processing circuit 105. When the phases of both signals are reversed phases, in other words, phases of current flowing from the load side L to the poser side K of the zero-phase current transformer, the circuit recognizes that the current is a suffered current due to a ground fault on the power side and further outputs a suffered-phase detection signal to the suffered-operating-condition judging circuit 108. In the suffered-operating-condition judging circuit 108, when the voltage-level detection signal and the suffered-phase detection signal are inputted simultaneously, the above circuit transmits the suffered-operating-condition detection signal to an output-stop-signal outputting circuit 109 from which an output stop signal is transmitted to the output control circuit 104 to perform the control of stopping transmitting of the leakage alarm signal to the output circuit. Thus, the earth leakage cutoff operation is locked to avoid the suffered operation with no cutoff operation.

In case that the detected current value exceeds the established dynamic sensitivity current value, if the suffered-phase detecting circuit 107 judges that the current phase signal has the same phase as that of the voltage phase signal or the circuit wire-to-ground voltage Vdb does not reach the established dynamic sensitivity voltage value capacitance, no output is generated since the judgment requirement at the suffered-operating-condition judging circuit 108 that the voltage-level detection signal has to be inputted simultaneously with the suffered-phase detection signal is not satisfied. Therefore, as no signal is outputted from the suffered-operating-condition judging circuit 108 to subsequent circuits, the leakage alarm signal is transmitted to the output circuit via the output control circuit to activate the breaker, as similar to the usual earth leakage breaker.

In the earth leakage breaker with suffering-lock by application of the present invention, as mentioned above, if only establishing an appropriate operating inception voltage for suffering-lock, i.e. an appropriate dynamic sensitivity voltage value from both the maximum wire-to-ground voltage and the dynamic sensitivity current of a circuit which shares a B-class grounding construction with the circuit wire-to-ground capacitance of a circuit to be monitored, then the earth leakage breaker operates as the conventional high-sensitivity leakage breaker until a ground-fault condition that a ground-fault current producing the above-established voltage flows through the circuit wire-to-ground resistance Rdb. On the other hand, in a ground-fault condition with the likelihood of a suffered operation that a ground-fault current exceeding the above ground-fault current flows, the earth leakage breaker does not perform unnecessary cutoff operation, as long as the suffered operational condition is detected despite the presence of a suffered current exceeding the established dynamic sensitivity current value of the earth leakage breaker. Accordingly, it is possible to establish an earth leakage breaker for its high-sensitive operation with a sense of security As one example of use, we explain a case of arranging the earth leakage breaker with suffering-lock of the invention in a monitored circuit of a single-phase three-line transformer (105-105/210V) in a substation having a Y-connection transformer of 50 Hz/420V in a group of transformers sharing the B-class grounding construction, the monitored circuit having a circuit wire-to-ground capacitance of 3 μf in total. As for the establishment of a dynamic sensitivity voltage in case of setting a sensed current of the installed earth leakage breaker to 30 mA in view of preventing an electric shock, an anticipated maximum circuit wire-to-ground voltage becomes 420/√3=242V at a complete single-line ground fault of 420V, while an anticipated suffered current at this time becomes from $\omega_{cv}$ to 228 mA. As the earth leakage breaker with a sensed current of 50 mA has an non-operating current less than 50% of the sensed current, i.e. 15 mA, the established dynamic sensitivity voltage value for initiating the suffering-lock function will be 15.9V[=242V×(15/228)]. Suppose that, for reference's sake, the circuit wire-to-ground resistance Rdb is 10Ω. Then, it is found that this condition exhibits a 1.59 A ground phenomenon having a ground-fault resistance of about 141Ω. That is, for the electrical-shock guard leakage breaker of a circuit about which the ground-fault current of 24.2 A is anticipated under the complete ground fault at a 400V-system, while a maximum suffered current of 228 mA is anticipated in the wire-to-ground capacitance of 3 μf, it is possible to use the dynamic sensitivity current of 30 mA without worrying about a suffered operation.

Moreover, suppose that the dynamic sensitivity current value is set to 15 mA under this condition. If a 105V-system circuit to be monitored is subjected to a ground fault with a ground-fault resistance 7 kΩ, then the ground-fault current Ig becomes 0.015 A(=105/7010), so that a leakage alarm signal is generated. As the circuit wire-to-ground voltage Vdb is 0.15V(=Rdb×Ib) below the established dynamic sensitivity voltage value so that the suffered-operating-condition judging circuit does not operate, the output control circuit is not operated. Therefore, with the leakage alarm signal, this breaker will cut off the circuit after an operational time period has passed, as similar to the conventional leakage breaker. If a spark ground fault of approx. 0Ω in the resistance Rg is generated in a 420V Y-connection transformer system as the other transformer system, which is not a circuit to be monitored, then the ground-fault current Ig(=242/10=24.2 A) continues to flow till this system is rehabilitated. As this ground-fault current Ig exceeds the dynamic sensitivity current value 15 mA, the leakage alarm signal is supplied to the output control circuit. On the other hand, as the circuit wire-to-ground voltage Vdb is 242V(=Rdb×Ib) over the established dynamic sensitivity voltage value 15.9V, the voltage-level detection signal is generated. Moreover, as the current phase signal and the voltage phase signal are inputted to the suffered-phase detecting circuit, it is judged that the phase of a leakage current is a suffered-current phase, generating the suffered-phase detection signal. Then, the suffered-operating-condition judging circuit outputs the suffered-operating-condition detection signal to the output-stop-signal outputting circuit since the voltage-level detection signal and the suffered-phase detection signal are supplied simultaneously. Further, the suffered-operating-condition detection signal as the output stop signal is supplied to the output control circuit where the control of denying the leakage alarm signal and stopping the output signal is performed. Consequently, the cutoff function of the earth leakage breaker is locked to its inactivated condition, so that an unnecessary operation caused by the suffered current is avoided.

Embodiment 2

Figure 4:
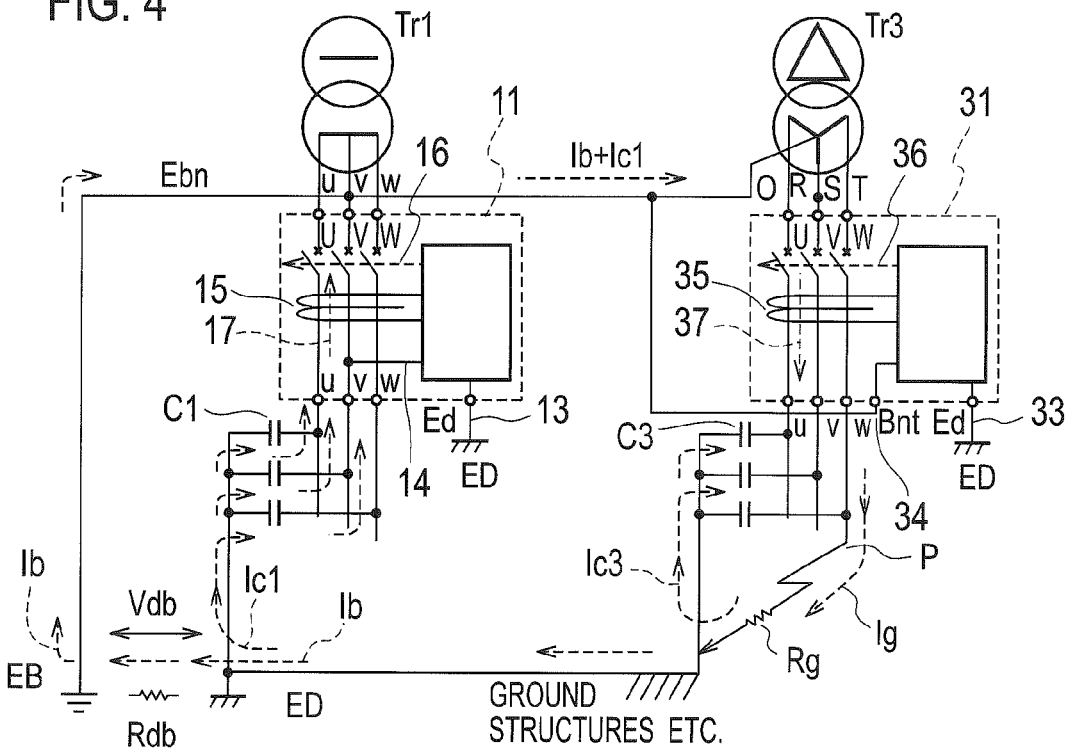
FIG. 4 is a diagram showing an embodiment that earth leakage breakers with suffering-lock of the present invention are installed in a low-voltage main circuit of a transformer of a substitution formed by the single-phase three-wire system transformer and a three-phase three-wire delta connection type transformer undertaking the common B-class grounding construction.

FIG. 4 showing an embodiment that the earth leakage breakers 11 and 31 with suffering-lock of the present invention are installed in a substation where both the neutral phase v of the single-phase three-wire system electric light transformer Tr1 and a neutral point terminal O of a three-phase three-wire Y-connection type power transformer Tr3 are collectively connected to the common ground bus Ebn for B-class grounding and further connected to the grounding electrode EB of the B-class grounding construction. The earth leakage breaker 31 with suffering-lock is provided, for the three-phase three-wire Y-connection type power transformer, with a B-class grounding electrode connecting terminal Bnt as an independent terminal. This terminal is connected to the neutral terminal O of the Y-connection type power transformer through a connecting wire 34. The embodiment 2 is similar to the embodiment 1 with respect to the flow of a suffered current by a ground fault at the point P and the fundamental operation of the earth leakage breakers with suffering-lock.

Figure 5:
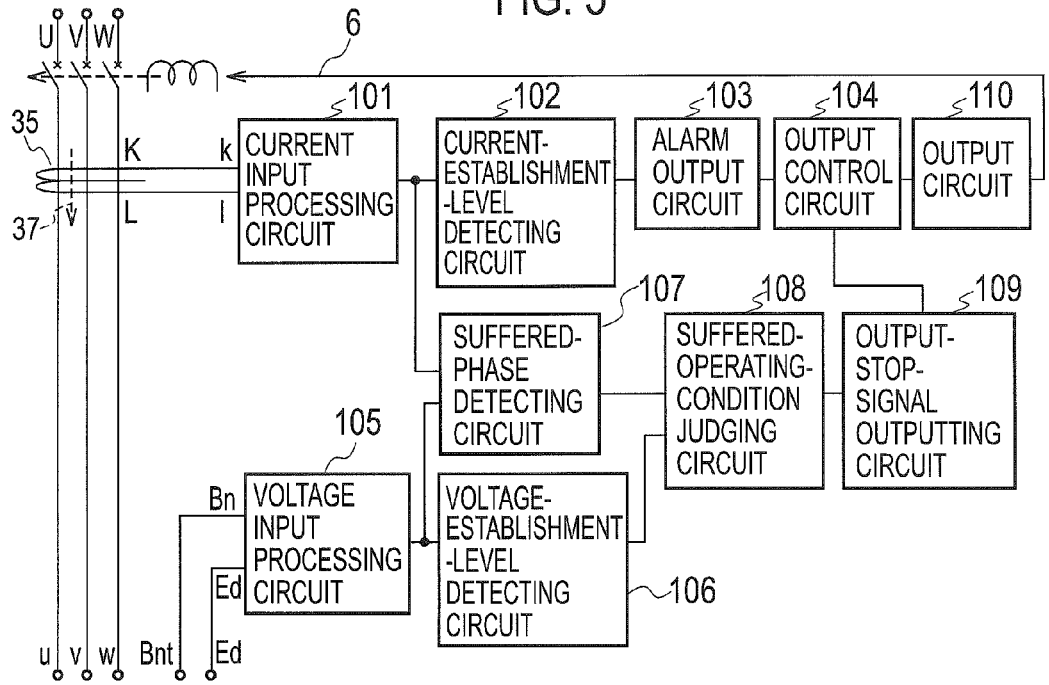
FIG. 5 is an operational distribution diagram of the earth leakage breaker with suffering-lock for the single-phase three-wire system transformer

FIG. 5 is a distribution diagram of the earth leakage breaker 31 with suffering-lock, which is provided, as an independent terminal, with the B-class grounding electrode connecting terminal Bnt for the three-phase three-wire Y-connection type power transformer. In even a circuit for a single-phase three-wire system transformer or a three-phase three-wire delta-connection system transformer, this earth leakage breaker could be used as a general-purpose breaker by connecting the terminal Bnt with a B-class grounding phase of the circuit.

Embodiment 3

Figure 6:
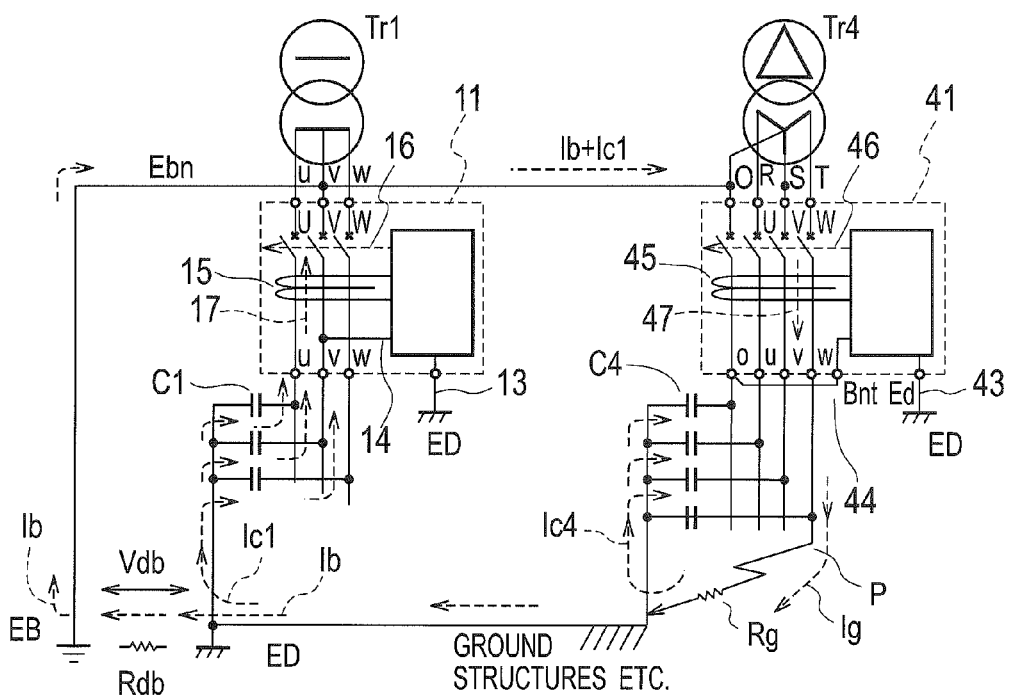
FIG. 6 is a diagram showing an embodiment that earth leakage breakers with suffering-lock of the present invention are installed in a low-voltage main circuit of a transformer of a substitution formed by the single-phase three-wire system transformer and a three-phase four-wire Y-connection type transformer undertaking the common B-class grounding construction.

FIG. 6 showing an embodiment that the earth leakage breakers 11 and 41 with suffering-lock of the present invention are installed in a substation where both the neutral phase v of the single-phase three-wire system electric light transformer Tr1 and a neutral point terminal O of a three-phase four-wire Y-connection type power transformer Tr4 are collectively connected to the common ground bus Ebn for B-class grounding and further connected to the grounding electrode EB of the B-class grounding construction. For a three-phase four-wire Y-connection type power transformer, the earth leakage breaker 41 with suffering-lock includes a main circuit for four wires and a B-class grounding electrode connecting terminal Bnt as an independent terminal, constituting the earth leakage breaker with suffering-lock of the present invention. This terminal is connected to the neutral terminal O of the Y-connection type power transformer through a connecting wire 44. The embodiment 3 is similar to the embodiment 1 with respect to the flow of a suffered current by a ground fault at the point P and the fundamental operation of the earth leakage breakers with suffering-lock, with the exception of adding a wire-to-ground capacitance C4 and a breaker's own suffered current Ic4 in the grounding circuit.

Figure 7:
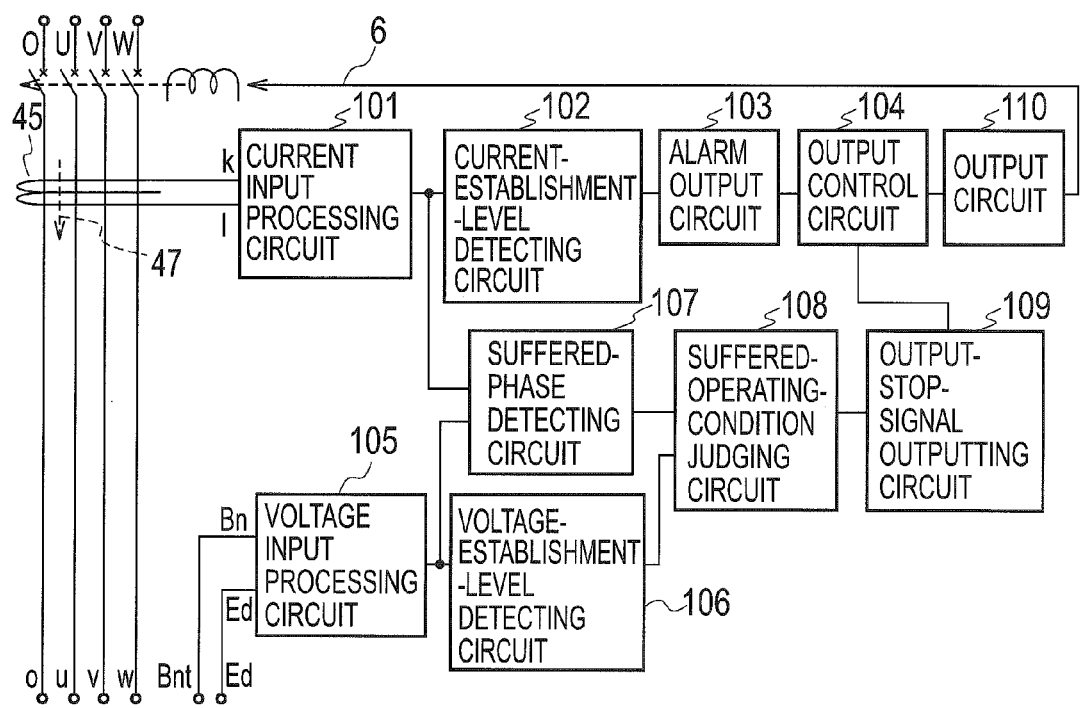
FIG. 7 is an operational distribution diagram of the earth leakage breaker with suffering-lock for the three-phase four-wire Y-connection type transformer.

FIG. 7 is a distribution diagram of the earth leakage breaker 41 with suffering-lock, which includes the four-wire main circuit for a three-phase four-wire Y-connection type power transformer and the B-class grounding electrode connecting terminal Bnt as an independent terminal. In even a circuit for a single-phase three-wire system transformer, a three-phase three-wire delta-connection system transformer or a three-phase three-wire Y-connection system transformer, this earth leakage breaker could be used by connecting the terminal Bnt with a B-class grounding phase of the circuit.

Embodiment 4

Figure 8:
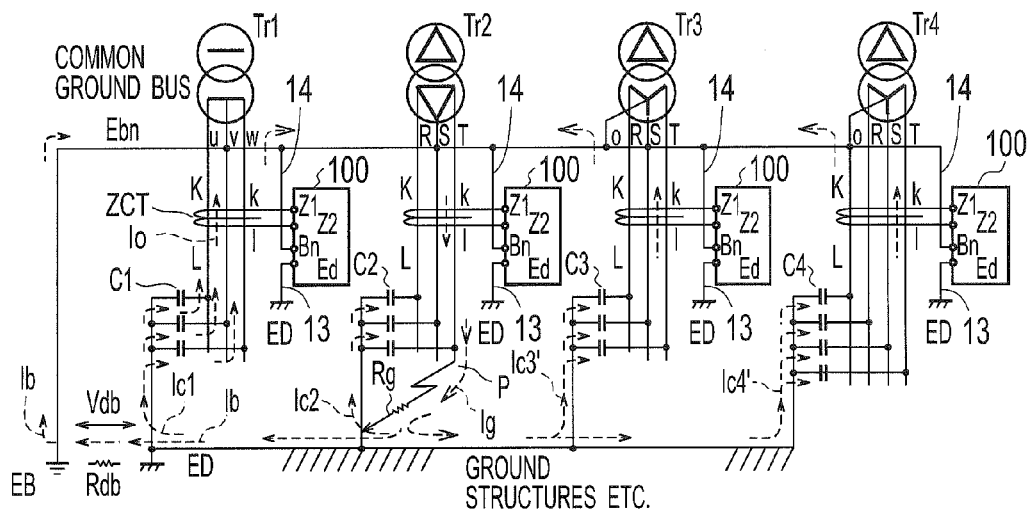
FIG. 8 is a diagram showing an embodiment that earth leakage relays with suffering-lock of the present invention are installed in a low-voltage main circuit of a transformer of a substitution formed by the single-phase three-wire system transformer, the three-phase three-wire delta connection type transformer, the three-phase three-wire Y-connection type transformer and the three-phase four-wire Y-connection type transformer undertaking the common B-class grounding construction.

FIG. 8 showing an embodiment that earth leakage relays 100 with suffering-lock of the present invention are installed in a substation where the neutral phase v of the single-phase three-wire system electric light transformer Tr1, the end S phase of the three-phase three-wire delta-connection type power transformer Tr2, the neutral point terminal O of the three-phase three-wire Y-connection type power transformer Tr3 and the neutral point terminal O of the three-phase four-wire Y-connection type power transformer Tr4 are collectively connected to the common ground bus Ebn for B-class grounding and further connected to the grounding electrode EB of the B-class grounding construction. The embodiment 4 is similar to the embodiment 1 with respect to the flow of a suffered current by a ground fault at the point P and the operation of the earth leakage breakers with suffering-lock, with the exception of adding currents Ic3' and Ic4' flowing through the capacitances C3 and C4 respectively and no cut-off mechanism.

Figure 9:
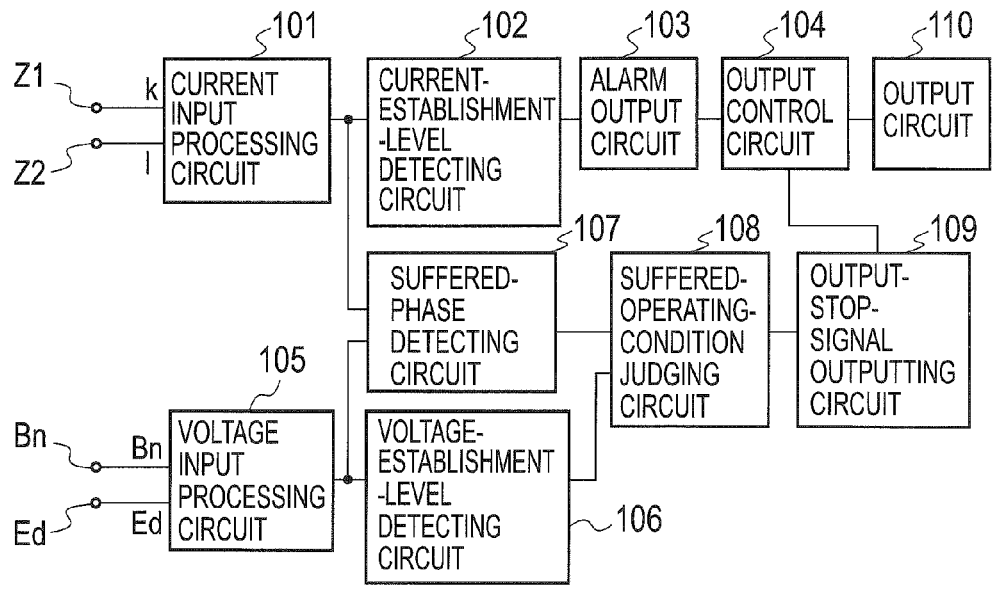
FIG. 9 is a distribution diagram of the earth leakage relay with suffering-lock.

FIG. 9 is a distribution diagram of the earth leakage relay 100 with suffering-lock. This earth leakage relay could be used for various connection type transformers by connecting terminals Z1, Z2 with the signal output terminals k, 1 of the transformer ZCT, connecting the terminal Bn with the B-class grounding phase of the circuit and by connecting the terminal Ed with the D-class grounding electrode or the like.

INDUSTRIAL APPLICABILITY

The effective utilization can be expected by the application of the present invention on an insulating ground-fault monitoring device and an insulating ground-fault relay.

The invention claimed is:

1. An earth leakage detector comprising:
an output control circuit structured to stop an output operation of the earth leakage detector under the following conditions:
when a leakage current of a circuit to be monitored, the leakage current being detected by a zero-phase current transformer, exceeds a dynamic sensitivity current value established for leakage alarm and earth blocking;
when the phase of the leakage current based on the phase of a circuit wire-to-ground voltage produced between a B-class grounding phase for the circuit to be monitored or a group of transformers and a D-class grounding electrode or a ground structure of an electrical equipment connected to the D-class grounding electrode, is judged as the phase of a suffered current flowing from a load side L of the zero-phase current transformer toward a power side K thereof; and
when the circuit wire-to-ground voltage exceeds a dynamic sensitivity voltage value established for preventing suffered operations.

2. An earth leakage relay comprising:
a leakage detecting circuit formed by:
a zero-phase current transformer structured to detect a leakage current of a circuit to be monitored;
a current-establishment-level detecting circuit structured to transmit a leakage occurrence signal when a value of the leakage current detected by the zero-phase current transformer exceeds a dynamic sensitivity current value established for leakage alarm and earth blocking; and
an alarm output circuit structured to generate a leakage alarm signal on receipt of the leakage occurrence signal;
a suffered-phase detecting circuit structured to detect a circuit wire-to-ground voltage produced between a common B-class ground circuit for the circuit to be monitored or a group of transformers and a D-class grounding electrode or a ground structure of an electrical equipment, connected to the D-class grounding electrode and also to generate a suffered-phase detection signal when the direction of the leakage current judged based on the phase of the circuit wire-to-ground voltage is identical to the direction of a suffered current flowing from a load side L of the zero-phase current transformer toward a power side K thereof;
a voltage-establishment-level detecting circuit structured to generate a voltage-level detection signal when the circuit wire-to-ground voltage exceeds a dynamic sensitivity voltage value;
a suffered-operating-condition judging circuit structured to output a suffered-operating-condition detection signal when both the suffered-phase detection signal and the voltage-level detection signal accord with each other established for preventing suffered operations;
an output-stop-signal outputting circuit structured to transmit an output stop signal to an output control circuit on receipt of the suffered-operating-condition detection signal; and
the output control circuit structured to stop the leakage alarm signal transmitted by the leakage detecting circuit on receipt of an output stop signal.

3. An earth leakage breaker comprising:
a leakage detecting circuit formed by:
a zero-phase current transformer structured to detect a leakage current of a circuit to be monitored;
a current-establishment-level detecting circuit structured to transmit a leakage occurrence signal when a value of the leakage current detected by the zero-phase current transformer exceeds a dynamic sensitivity current value established for leakage alarm and earth blocking; and
an alarm output circuit structured to generate a leakage alarm signal on receipt of the leakage occurrence signal;
a suffered-phase detecting circuit structured to detect a circuit wire-to-ground voltage produced between a common B-class ground circuit for the circuit to be monitored or a group of transformers and a D-class grounding electrode or a ground structure of an electrical equipment, connected to the D-class grounding electrode and structured to generate a suffered-phase detection signal when the direction of the leakage current judged based on the phase of the circuit wire-to-ground voltage is identical to the direction of a suffered current flowing from a load side L of the detecting zero-phase current transformer toward a power side K thereof;

a voltage-establishment-level detecting circuit structured to generate a voltage-level detection signal when the circuit wire-to-ground voltage exceeds a dynamic sensitivity voltage value established for preventing suffered operations;

a suffered-operating-condition judging circuit structured to output a suffered-operating-condition detection signal when both the suffered-phase detection signal and the voltage-level detection signal accord with each other;

an output-stop-signal outputting circuit structured to transmit an output stop signal to an output control circuit on receipt of the suffered-operating-condition detection signal; and the output control circuit structured to stop the leakage alarm signal transmitted by the leakage detecting circuit on receipt of an output stop signal.

* * * * *